United States Patent
Furukawa et al.

(10) Patent No.: US 7,605,089 B2
(45) Date of Patent: Oct. 20, 2009

(54) METHOD OF MANUFACTURING AN ELECTRONIC DEVICE

(75) Inventors: Yukiko Furukawa, Leuven (BE);
Robertus Adrianus Maria Wolters, Eindhoven (NL)

(73) Assignee: NXP B.V., Eindhoven (NL)

( * ) Notice: Subject to any disclaimer, the term of this patent is extended or adjusted under 35 U.S.C. 154(b) by 143 days.

(21) Appl. No.: 10/557,098

(22) PCT Filed: May 12, 2004

(86) PCT No.: PCT/IB2004/050664
§ 371 (c)(1),
(2), (4) Date: Nov. 16, 2005

(87) PCT Pub. No.: WO2004/102279
PCT Pub. Date: Nov. 25, 2004

(65) Prior Publication Data
US 2007/0032086 A1 Feb. 8, 2007

(30) Foreign Application Priority Data
May 19, 2003 (EP) .................................. 03101395

(51) Int. Cl.
*H01L 21/302* (2006.01)

(52) U.S. Cl. .................. 438/708; 438/706; 438/709; 438/710; 430/310; 430/316

(58) Field of Classification Search ................ 438/706, 438/710, 712, 714, 720, 717, 736, 708, 709; 430/310, 316
See application file for complete search history.

(56) References Cited

U.S. PATENT DOCUMENTS

| | | | |
|---|---|---|---|
| 4,245,027 A * | 1/1981 | Takeda et al. | 430/141 |
| 5,946,799 A * | 9/1999 | Yamamoto et al. | 29/852 |
| 6,103,445 A * | 8/2000 | Willson et al. | 430/270.1 |
| 6,103,457 A | 8/2000 | Gabriel | |
| 6,136,723 A * | 10/2000 | Nagase | 438/725 |
| 6,183,940 B1 | 2/2001 | Lin et al. | |
| 6,544,894 B1 * | 4/2003 | Kobayashi | 430/5 |
| 6,680,157 B1 * | 1/2004 | Fedynyshyn | 430/270.1 |
| 6,806,021 B2 * | 10/2004 | Sato et al. | 430/198 |
| 2002/0111017 A1 * | 8/2002 | Kirkpatrick et al. | 438/638 |
| 2003/0096504 A1 * | 5/2003 | Ryu et al. | 438/694 |

\* cited by examiner

*Primary Examiner*—Lan Vinh

(57) ABSTRACT

A method of manufacturing an electronic device is provided wherein an interconnect is made using 193 nm lithography. No deformation of the desired linewidth takes place in that during a plasma gas is used which dissociates in low-weight ions. The electronic device is particularly an integrated circuit.

26 Claims, 3 Drawing Sheets

248nm PR 193nm PR a      b

Ar/CF4/O2   Ar/CF4/CH2F2/O2   Ar/CH2F2/O2

Ar/CF4/O2   Ar/CH2F2/O2

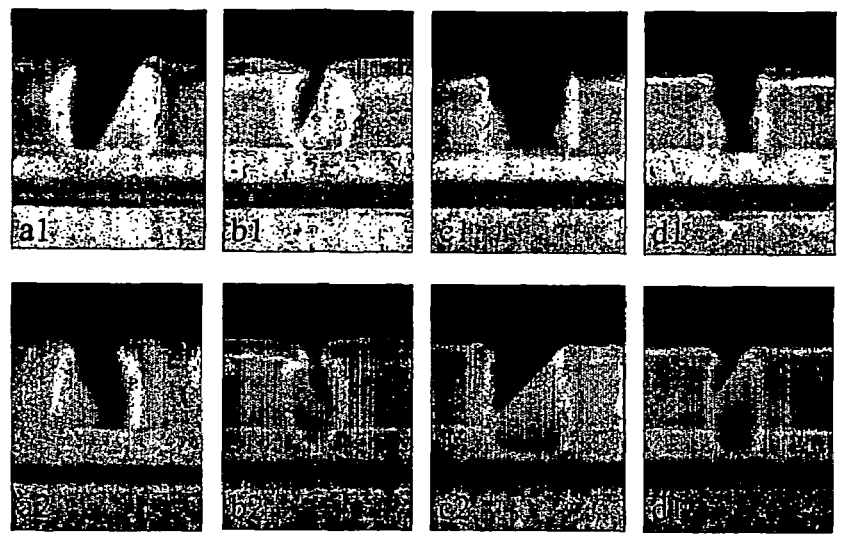
FIG.5
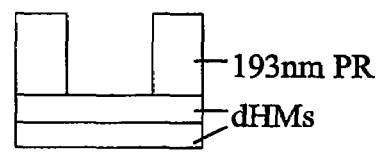
FIG.6a
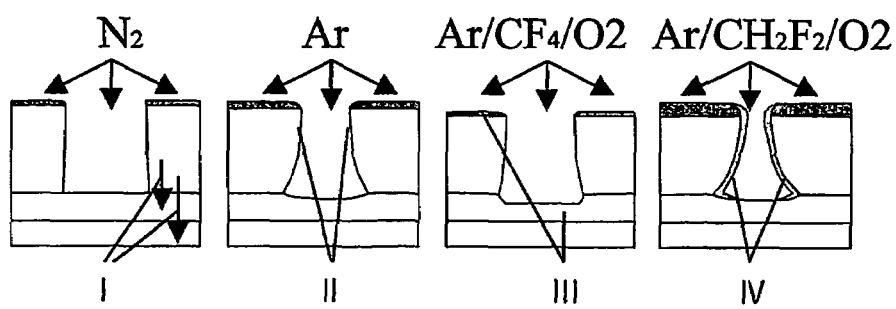
FIG.6b
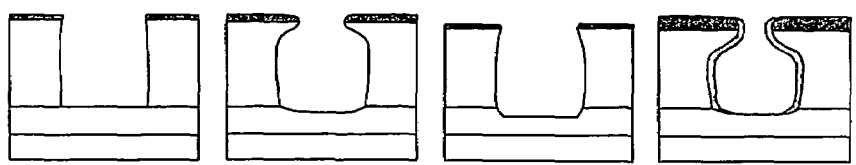
FIG.6c
FIG.6

METHOD OF MANUFACTURING AN ELECTRONIC DEVICE

The invention relates to a method of manufacturing an electronic device comprising a plurality of electrical elements and an interconnect structure interconnecting said electrical elements according to a desired pattern, in which method a vertical interconnect is provided by:

providing at least one layer of dielectric material onto an electrically conductive surface;

providing a photoresist layer suitable for irradiation at a wavelength of at most 200 nm;

irradiating the photoresist layer at a wavelength of at most 200 nm and developing it; and patterning the layer of dielectric material.

Such a method is for instance known from Habermas et al., Proc.SPIE, 4689 (2002), 92-101. In the method use is made of radiation with a wavelength λ of 193 nm, that originates from an ArF source. Such radiation is used to meet the requirements of the ITRS road map for downscaling of circuit design.

It is a problem of the known method, as stated by Habermas, that the photoresist shows deformation, as a result of which the diameter of the vertical interconnect is uncontrollably smaller than desired. The reduction of the diameter—also known as linewidth shrink—can be more than 20%.

It is therefore an object of the invention to provide a method of the kind mentioned in the opening paragraph, in which no deformation of the photoresist occurs.

This object is achieved in that a plasma ignition step is performed with a plasma gas dissociating in ions with an atomic mass that is at most equal to that of CF. It was found in experiments leading to the invention, that the deformation of the photoresist layer is due to expansion effects. These expansion effects occur due to heating of the photoresist layer by ion bombardment It thus turned out that the photoresist deformation can be prevented if the first step of the dry etching process is performed with low-weight ions. Unlike a $CF_2H_2$ gas dissociating in $CF_2$-ions or an Ar gas, the use of a $CF_4$ gas dissociating in CF-ions and the use of a $N_2$-gas does not lead to deformation of the photoresist.

It is an advantage of the method of the invention that any desired etchant can be used for etching the layer or layers of dielectric material. In particular, it is possible to use a fluor containing gas, such as $Ar/CH_2F_2/O_2$.

Without being bound by any theory, the inventors try to explain the above-mentioned observations as follows: the plasma ignition step has a chemical effect on the photoresist The photoresist becomes chemically modified, and thus is not sensitive anymore to heat treatments or to high-energy ion bombardments, after the plasma ignition step.

Furthermore, if the photoresist is deformed during the plasma ignition step, the deformation does not disappear afterwards.

One possible chemical effect is the completion of incomplete conversions of reactive groups. In the case of (meth) acrylates, this is the completion of an incomplete polymerization.

An additional explanation given for the deformation is that softening of the photoresist material occurs by cleavage of bonds in the main chain of the polymer of the photoresist.

Preferred plasma gases for the patterning of the photoresist layer are $N_2$ and He. These low-weight gases have the advantage that they do not react chemically with the organic material of the photoresist Thus it is easier to prevent any deformation of the photoresist.

The photoresist layer suitable for irradiation at a wavelength of at most 200 nm is a chemical system which is in effect completely different from chemical systems in use for irradiation at larger wavelengths, such as λ=248 nm. The photoresist layer used for these short wavelengths turns out to have a less stable structure, that is needed to cope with the high-energy radiation without affecting underlying layers. This can be attributed to the fact that the photoresists for these wavelengths are generally copolymers having chains with ring-shaped groups, and polar side groups. Due to the polar groups the chains are thought to have more interaction. Due to the ring-shaped groups the chains are voluminous. Certainly the chain is less regular than vinyl based polymers, such as polystyrene, that are commonly used as 248 nm photoresists. This leads to a less stable structure. Heat supply in particular may therefore lead to considerable expansion and thus deformation. Alternatively, the photoresists are poly(methyl)acrylates, which have a low glass temperature and a high coefficient of thermal expansion, and are also sensitive to deformation.

Examples of photoresist systems include those based on ring opening metathesis polymer—for instance a copolymer of an ester—and alkyl substituted cyclopentylethylene and a norbornene-substituted cyclopentylethylene; or a poly(substituted cyclopentylethylene) or poly(substituted cyclohexylethylene), the substitutions being for instance 3,3-diesters; (meth)acrylates with a-cyclic pendant groups and polar pendant groups; which is polymerized up on irradiation; alternating copolymers of maleic anhydride and a cyclic olefin, such as norbornene, that may be substituted with polar groups, alkyl groups and protective groups; alternating copolymers of vinyl ethers and maleic anhydride, further substituted with esters or other protective groups; polymers on the basis of cyclic olefins such as norbornene, with different substitutions to the norbornene units, such as acid, esters, alkyls.

Particularly suitable are photoresist layers comprising a material chosen from the group of polyacrylates and polymethacrylates.

In a preferred embodiment, not just one layer, but a stack of layers of dielectric material is provided onto the conductive surface, which stack comprises at least one layer of a low-K material. Low-K materials are materials with a very low dielectric constant, particularly $\in_r \leq 2.5$, and preferably $\in_r \leq 2.0$. They have an internal structure which is very open or even porous. Well-known examples include MSQ, HSQ, SiLK, benzocyclobutene, and organically modified porous silica. The problem with such layers is the mechanical stability of the stack. When using thin layers of various dielectric materials this problem tends to be overcome, however. This approach however makes the etching even more critical. It has turned out that the method of the invention is completely suitable for this kind of stack.

Any vertical interconnect is obtained as a result of the fact that the contact windows formed for the patterning of the dielectric layer are filled with an electrically conductive material. Examples include Aluminum, Tungsten, Nickel, Gold, Silver and Copper. The filling of the contact windows can be suitably done using a damascene or dual-damascene process. As known by the skilled person, barrier layers such as TiN and TaN and plating bases may be provided in advance of filling the contact window with the said electrically conductive material.

The resulting vertical interconnect has preferably a diameter in the range of 10 to 25 nm. Its side walls are straight, and the size is completely predictable. This interconnect is particularly useful for use in integrated circuits, in which the electrical elements are (mainly) transistors. However, it is suitable as well for use in thin-film networks, biosensors and other applications.

These and other aspects of the method of the invention will be further discussed with reference to the Figures, in which:

FIGS. 3-5 show SEM pictures of experiments in accordance with the invention;

FIG. 6 shows diagrammatic cross-sectional views of the deformation as dependent on the plasma gas used.

Figure 1:
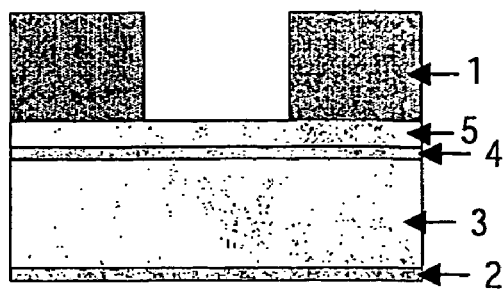
FIG. 1 shows a diagrammatic cross-sectional view of a stack of dielectric layers and the photoresist layer for use in the method.

1. Photoresist and Spin-on Low-K Material Properties:

FIG. 1 shows a diagrammatic cross-sectional view of a stack of dielectric layers 2, 3, 4, 5 and the photoresist layer 1 for use in the method. The photoresist layer 1 is a 193 nm photoresist. It is commercially available as JSR AR414J and comprises polyacrylate and polymethacrylate. For reasons of comparison, experiments were also carried out with a 248 nm photoresist, commercially available as JSR TMX1265G and including ESCAP (environmentally stable chemically amplified photoresist). This 248 nm photoresist is composed of polystyrene. As dielectric materials 2, 3, 4, 5 a stack was used of a first layer 2, a second layer 3, a third layer 4 and a fourth layer 5. The first and the third layer 2,4 comprise a low-K spin-on hard mask known as FF-02. FF-02 is polyarylene-based material with a dielectric constant of around 3.3. The second layer 3 was a low-K material JSR LKD-5109, which is a porous MSQ-type material with a dielectric constant of around 2.2. The fourth layer 5 was a spin-on glass material, in particular a low-K Spin-on Hard Masks (SoHM) of a MSQ-type material with a dielectric constant of around 3.0. The material is known as SOG04 and SOG041. SOG041 is modified SOG04 to be compatible with 193 nm photoresist.

2. Stack of Dielectric Layers and Patterning:

The stack is shown in FIG. 1. LKD-5109, FF-02, SOG04 and SOG041 were coated using a TEL Clean Track ACT8 SOD with dynamic dispense. 248 nm photoresist and 193 nm photoresist were spin-coated on the top of SoHMs and were developed using TEL Clean Track ACT8, and were exposed using ASML PAS 5500/750 and 5500/950, respectively. LKD-5109, SOG04 and SOG41 were etched in a Lam Exelan, where fluorocarbon chemistry, Ar, O2 and N2 were used, whereas to etch FF-02 in a Lam Versys, high density TCP etch tool, N2/O2 chemistry was used.

Figure 2:
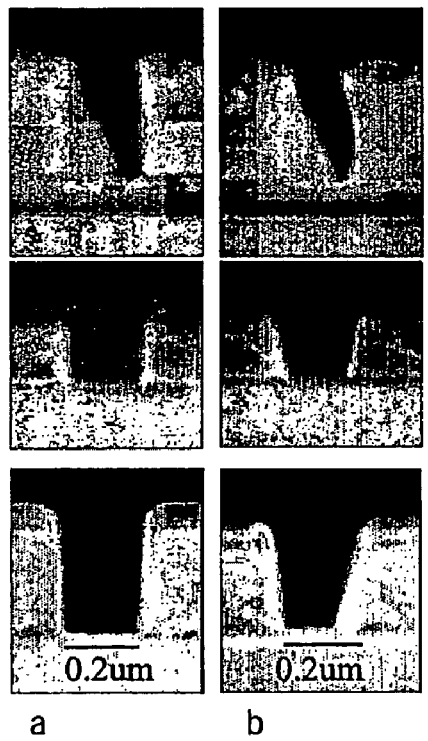
FIG. 2 shows SEM pictures of prior art methods.

3. Patterning of Dielectric Layers Using 248 nm Photoresist and 193 nm Photoresist:

In FIG. 2 the patterning procedure (left) and x-section SEM photos of each etch steps using 248 nm photoresist (FIG. 2a, left) and 193 nm photoresist (FIG. 2b, right) are shown. The same etch conditions were applied for both stacks with 248 nm photoresist and 193 nm photoresist. The steps included patterning of the fourth layer 5 with $Ar/CF_4/CH_2F_2/O_2$ gas; etching of the third layer 4 and stripping of the photoresist layer 1 using $N_2/O_2$ gas; and patterning of the second layer 3 using $Ar/CF_4/CH_2F_2/O_2$ gas. Linewidth of 248 nm photoresist and 193 nm photoresist before etch are 0.2 μm and 0.25 μm, respectively. After etch of MSQ type SoHM, 193 nm photoresist deformation and a sidewall slope of top of SoHM were observed. While 248 nm photoresist also shows a slight deformation on the top, but less severe than 193 nm photoresist, no sloping sidewall was observed. After etch of organic of SoHM using 193 nm photoresist, a slope of both SoHMs was observed. After etch of LKD-5109 a narrow linewidth of around 0.2 μm resulted for a 0.25 μm trench target using 193 nm photoresist, which is a 20% linewidth shrink. Using 248 nm photoresist no slope of SoHMs sidewall was observed, resulting in an appropriate linewidth (around 0.2 μm) for a 0.2 μm trench target.

Figure 3:
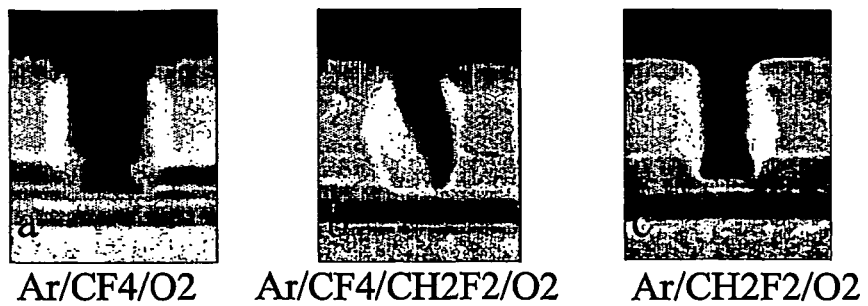

4. Effect of Etch Conditions on 193 nm Photoresist Deformation and Sidewall Slope of the Top of MSQ Type SoHM:

In FIG. 3 x-section SEM photos are shown after the top of MSQ type SoHM has been etched using 193 m photoresist under different etch conditions. (As standard recipe Ar/CF4/CH2F2/O2 chemistry with 200 mTorr range of pressure, 1 kW range of 27 MHz power and 0.5 kW range of 2 MHz power were chosen). Shown are SEM photos of a 0.25 μm trench/0.25 μm space structure after etch of the top of MSQ type SoHM using 193 nm photoresist. FIGS. 3(a)-(c) show the effect of different fluorocarbon chemistries with the same pressure and power setting of the etch. Ar/CF4/O2 chemistry gives almost no photoresist deformation and no slope of HM sidewall in FIG. 3(a). Photoresist deformation and sidewall slope occurs by a partial substitution of CF4 to CH2F2 (FIG. 3b), and is enhanced by complete replacement by CH2F2 in FIG. 3c. A polymerizing chemistry like CH2F2 gives more photoresist deformation than a less polymerizing chemistry like CF4. FIGS. 3(d)-(f) show the effect of pressure and power setting of etch with an $Ar/CF_4/CH_2F_2/O_2$ chemistry. In FIG. 3(d) a 50% lower pressure and the same power setting as in (a)-(c) is used; In FIG. 3(e) a 2 times higher 2 MHz power and the same pressure and the 27 MHz power setting of (a)-(c) is used. In FIG. 3(f) a 2 times higher 2 MHz power and a 50% lower 27 MHz power with the same pressure as in (a)-(c) is used.

Figure 4:
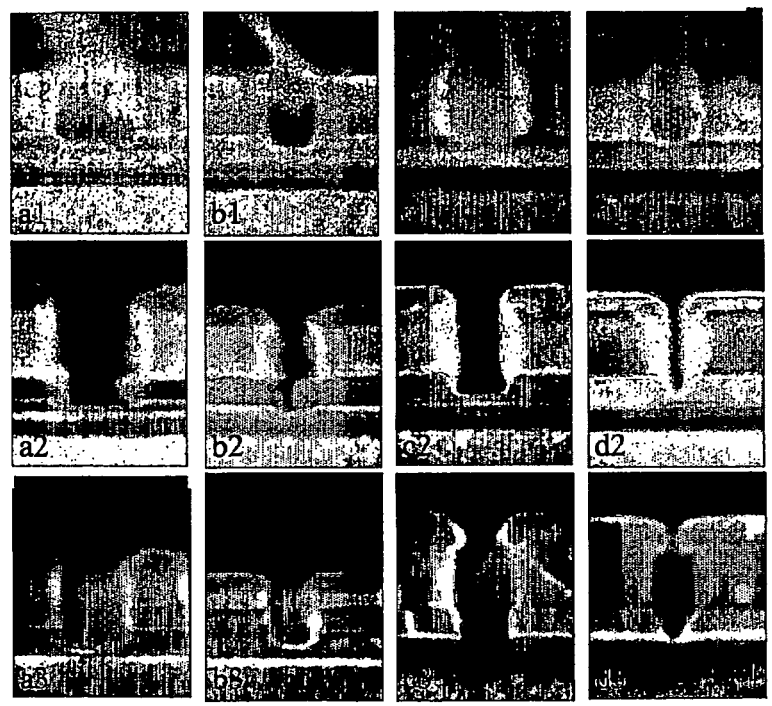

5. 193 nm Photoresist Deformation Phenomena Depending on Fluorocarbon Chemistry and Photoresist Coverage:

In FIG. 4 the progress of 193 nm photoresist deformation from plasma ignition to etching for 20 sec. using Ar/CF4/O2 chemistry (FIG. 4(a), (b)), and Ar/CH2F2/O2 chemistry (FIG. 4(c), (d)) is shown. FIG. 4(a), (c) show SEM photos of a 0.25 μm trench/0.25 μm space structure; FIG. 4(b), (d) show SEM photos of a 0.15 μm trench/0.35 μm space structure after etching of the top of MSQ type SoHM using (a), (b) Ar/CF4/O2 chemistry, (c), (d) Ar/CH2F2/O2 chemistry. Pressure and power setting are the same as in FIGS. 3(a)-(c).

Photoresist deformation begins at the plasma ignition using both Ar/CF4/O2 and Ar/CH2F2/O2 chemistry. The 0.15 μm trench/0.35 μm space structure, which has a higher photoresist coverage, has a more severe photoresist deformation. Here no micro-loading effect was observed. In the case of Ar/CF4/O2 chemistry, the top of SoHM was patterned already at plasma ignition and a round sidewall was formed due to photoresist deformation. After etching for 10 sec. (FIG. 4(a2), (b2)) photoresist deformation was still observed especially at 0.15 μm trench structures. However almost no slope of SoHM sidewall was observed. Trench sizes were within target. Further etching for 20 sec. seems to sputter the overhanging part of the photoresist, resulting in less photoresist deformation (FIG. 4(a3), (b3)). On the other hand, Ar/CH2F2/O2 chemistry gives more photoresist deformation and a lower etch rate of both SoHM and photoresist than Ar/CF4/O2 chemistry. At the plasma ignition step, the top of SoHM was slightly patterned, trench size was within target regardless of photoresist deformation (FIG. 4(c1), (d1)). Further etching for 10 sec. enhanced photoresist deformation due to polymerization on photoresist and sidewall, resulting in severe sidewall slope of the top of SoHM (FIG. 4(c2), (d2)). After etching for 20 sec., the 0.25 μm trench was reduced to less than 0.2 μm (FIG. 4(c3)). While the 0.15 μm trench structure had a the sidewall slope of 60 degrees and closed trench patterning due to extremely severe photoresist deformation (FIG. 4(d3)).

6. Effect of Ar or N2 Plasma Ignition on 193 nm Photoresist Deformation During Etching Using Ar/CH2F2/O2 Chemistry:

In FIG. 5 the effect of Ar or N2 plasma during ignition on 193 nm photoresist deformation is shown. FIGS. 5(a) and (c) show SEM photos of a 0.25 μm trench/0.25 μm space structure. FIGS. 5(b) and (d) show SEM photos of a 0.15 μm trench/0.35 μm space structure. In the experiments shown in FIGS. 5(a), (b) Ar plasma ignition was used and in FIGS. 5(c), (d) N2 plasma ignition was used. After plasma ignition Ar/CH2F2/O2 chemistry was used for etching. Pressure and power setting are the same as in FIGS. 3(a)-(c).

Ar plasma during the ignition (FIG. 5(a1), (b1)) gave a similar photoresist deformation as Ar/CH2F2/O2 ignition (FIG. 4(a1), (b1)), and also gave a modification on the surface of SoHM, therefore no patterning was observed on SoHM for 0.25 μm trench structure after etching for 10 sec. (FIG. 5(c2)). While the 0.15 μm trench structure has less modification by Ar plasma ignition due to narrow trench size and severe 193 nm photoresist deformation (FIG. 5(b2)). N2 plasma during ignition gave no photoresist deformation even for higher photoresist coverage structure. A slight photoresist deformation occurred by subsequent etching for 10 sec. using Ar/CH2F2/O2 chemistry. A straight sidewall was obtained for the 0.25 μm-trench structure and a less sloping sidewall was obtained for the 0.15 μm trench structure (FIG. 5(c2), (d2)).

7. Mechanisms for 193 nm Photoresist Deformation by Dry Etching:

The experiments were carried out using a 193 nm photoresist that primarily comprises polyacrylate and polymethacrylate, and using a 248 nm photoresist mainly consisting of polystyrene. Ion bombardment during the plasma etching heats up the surface of the photoresist and it expands rapidly until heat is transferred to underlying layers such as the layers of dielectric material and the semiconductor material. As a consequence of differences in glass temperature ($T_g$) and expansion coefficient, the 193 nm photoresist deformed more than 248 nm photoresist. The energy of the ion bombardment depends on the mass of the species of the used chemistry. Therefore, an ignition with Ar (m/e=40) and CH2F2 which is supposed to dissociate mainly to CF2 (m/e=50) gives more severe photoresist deformation than an ignition with N2 (m/e=14 (N); m/e=28 (N2)) and CF4 which is supposed to dissociate to CF (m/e=31) mainly. XPS results confirm that the ignition with N2 gives less modification of photoresist. Furthermore CF4 and CH2F2 react chemically with photoresist. CF4 chemistry removes photoresist and underlying dielectric layers, while CH2F2 chemistry causes polymerization on photoresist and sidewall. The chemistry used during plasma ignition determines photoresist deformation as shown in FIG. 6.

FIG. 6A shows the situation before any plasma ignition. FIGS. 6B and 6C show schematically situations for different plasmas used in the plasma ignition, during the plasma ignition (FIG. 6B) and after cooling (FIG. 6C). Situation I relates to the plasma gas $N_2$. In this case, it is assumed that the main mechanism is heat transfer to underlying layers. Situation II relates to the plasma gas Ar and situation IV relates to the plasma gas $Ar/CH_2F_2/O_2$. In this case there is expansion of the photoresist. In addition to expansion the plasma gas of situation IV also shows the characteristics of polymerisation. Situation III relates to the plasma gas $Ar/CH_4/O_2$. In this case the plasma ignition also leads to some etching, both of the photoresist and of the hard mask.

In summary, more than 20% linewidth shrink due to 193 nm photoresist deformation is observed during patterning of dielectric layers in an interconnect structure. A polymerizing chemistry like Ar/CH2F2/O2 gives significant 193 nm photoresist deformation, resulting in a sidewall slope of 60 degrees. 193 nm photoresist deformation can be suppressed by performing a plasma ignition step with a plasma gas dissociating in low-weight ions, such as N2, He and CF4 chemistries.

The invention claimed is:

1. A method of manufacturing an electronic device comprising a plurality of electrical elements and an interconnect structure interconnecting said electrical elements according to a desired pattern, said structure containing vertical interconnects through at least one layer of dielectric material, in which method the provision of the vertical interconnects comprises the steps of:
   providing at least one layer of dielectric material onto an electrically conductive surface;
   providing a photoresist layer on the at least one layer of dielectric material and suitable for irradiation at a wavelength of at most 200 nm;
   irradiating the photoresist layer at a wavelength of at most 200 nm and developing the photoresist layer to produce a patterned photoresist mask; and
   patterning the layer of dielectric material using the patterned photoresist mask, characterized in that before patterning the layer of dielectric material a plasma ignition treatment is performed on the patterned photoresist mask with a plasma gas dissociating in ions with an atomic mass that is at most equal to that of CF.

2. A method as claimed in claim 1, characterized in that the plasma gas is chosen from the group of $N_2$, He, $CF_4$.

3. A method as claimed in claim 2, wherein the plasma gas is $N_2$ or He.

4. A method as claimed in claim 1, characterized in that the photoresist layer comprises a material chosen from the group of polyacrylates and polymethacrylates.

5. A method as claimed in claim 1, characterized in that a stack of layers of dielectric material is provided onto the conductive surface, which stack comprises at least one layer of a low-K material.

6. A method as claimed in claim 1, characterized in that after patterning of the dielectric layer any resulting contact windows are filled with electrically conductive material, thereby providing the vertical interconnects.

7. A method as claimed in claim 1, characterized in that the electrical elements are transistors and the electronic device is an integrated circuit.

8. A method as claimed in claim 1, characterized in that the layer of dielectric material is patterned by dry etching.

9. A method as claimed in claim 8, characterized in that the layer of dielectric material is etched with a plasma gas comprising a fluorine-containing material.

10. A method as claimed in claim 2, characterized in that the layer of dielectric material is patterned by dry etching.

11. A method as claimed in claim 3, characterized in that the layer of dielectric material is patterned by dry etching.

12. A method of claim 9, wherein the plasma gas including a fluorine-containing material includes $Ar/CH_2F_2/O_2$.

13. A method of claim 1, wherein the plasma ignition treatment chemically modifies the photoresist.

14. A method of claim 13, wherein the chemical modification of the photoresist includes completion of incomplete reactive group conversions.

15. A method of claim 1, wherein the photoresist layer includes a material based on a ring opening metathesis polymer.

16. A method of claim 1, wherein the photoresist layer includes a copolymer of an ester.

17. A method of claim 1, wherein the photoresist layer includes an alkyl-substituted cyclopentylethylene, a norbornene-substituted cyclopentylethylene, a poly(substituted cyclopentylethylene), or a poly(substituted cyclohexylethylene).

18. A method of claim 1, wherein the photoresist layer includes a (meth)acrylate with a-cyclic pendant groups or polar pendant groups.

19. A method of claim 1, wherein the photoresist layer includes alternating copolymers of maleic anhydride and a cyclic olefin.

20. A method of claim 1, wherein the photoresist layer includes alternating copolymers of vinyl ethers and maleic anhydride.

21. A method of claim 5, wherein the at least one layer of a low-K material has a dielectric constant of 2.5 or less.

22. A method of claim 5, wherein the at least one layer of a low-K material includes MSQ, HSQ, SiLK, benzocyclobutene, or organically modified porous silica.

23. A method of manufacturing an electronic device comprising a plurality of electrical elements and an interconnect structure interconnecting said electrical elements according to a desired pattern, said structure containing vertical interconnects through at least one layer of dielectric material, in which method the provision of the vertical interconnects comprises the steps of:
providing a stack of layers of dielectric material onto an electrically conductive surface, wherein the stack of layers of dielectric material includes, in order on the electrically conductive surface, a first layer, a second layer, a third layer, and a fourth layer, and wherein the first and third layers include a polyarylene-based material, the second layer includes a porous MSQ-type material, and the fourth layer includes a spin-on glass material;
providing a photoresist layer suitable for irradiation at a wavelength of at most 200 nm;
irradiating the photoresist layer at a wavelength of at most 200 nm and developing the photoresist layer to produce a patterned photoresist mask; and
patterning the layer of dielectric material using the patterned photoresist mask, characterized in that before patterning the layer of dielectric material a plasma ignition treatment is performed on the patterned photoresist mask with a plasma gas dissociating in ions with an atomic mass that is at most equal to that of CF.

24. A method of manufacturing an electronic device, the method comprising:
forming a plurality of electrical elements; and
forming an interconnect structure that interconnects said electrical elements according to a desired pattern, by
providing stacked layers of dielectric material on an electrically conductive surface,
providing a photoresist layer suitable for irradiation at a wavelength of at most 200 nm,
irradiating the photoresist layer at a wavelength of at most 200 nm and developing the photoresist layer to produce a patterned photoresist mask,
plasma ignition treating the patterned photoresist mask with a plasma gas dissociating in ions with an atomic mass that is at most equal to that of CF,
patterning the layer of dielectric material using the treated photoresist mask, and
forming vertical interconnects extending through at least one of the stacked layers of dielectric material.

25. The method of claim 24, wherein the step of providing stacked layers includes providing, at least one layer including a polyarylene-based material, another layer including a porous MSQ-type material, and another layer including a spin-on glass material.

26. The method of claim 1, wherein the step of providing the photoresist layer includes forming the photoresist layer on the dielectric material to be patterned.

* * * * *